United States Patent [19]
Yoshioka et al.

[11] Patent Number: 5,376,216
[45] Date of Patent: Dec. 27, 1994

[54] DEVICE FOR HOLDING AND ROTATING A SUBSTRATE

[75] Inventors: Katsushi Yoshioka; Koji Nakagawa; Masayuki Itaba; Nobuyasu Hiraoka; Masafumi Takeoka, all of Kyoto, Japan

[73] Assignee: Dainippon Screen Mfg. Co., Ltd., Japan

[21] Appl. No.: 220,207

[22] Filed: Mar. 30, 1994

[30] Foreign Application Priority Data

Mar. 31, 1993 [JP] Japan ................. 5-098752

[51] Int. Cl.⁵ .................................................. C23F 1/02
[52] U.S. Cl. ............................... 156/345; 156/639; 156/640
[58] Field of Search .............. 118/728, 729, 730; 156/345, 639, 640

[56] References Cited

U.S. PATENT DOCUMENTS

| | | | |
|---|---|---|---|
| 4,278,493 | 7/1981 | Petvai | 156/643 |
| 5,070,813 | 12/1991 | Sakai | 118/695 |
| 5,081,069 | 1/1992 | Parker | 437/235 |
| 5,171,393 | 12/1992 | Moffat | 156/345 |
| 5,308,447 | 5/1994 | Lewis | 156/626 |

FOREIGN PATENT DOCUMENTS 51-32972 11/1976 Japan.
3-9607 1/1991 Japan.

Primary Examiner—R. Bruce Breneman
Assistant Examiner—Joni Y. Chang
Attorney, Agent, or Firm—Ostrolenk, Faber, Gerb & Soffen

[57] ABSTRACT

A plurality of substrate holding members and a substrate pressing member are disposed on a rotation stage at a peripheral portion. The substrate pressing member includes a magnet and is pivotally supported by the rotation stage. A ring-shaped permanent magnet is located below the rotation stage and forms a ring around the rotation axis of the rotation stage. When a substrate mounted on the rotation stage is rotated and processed, the ring-shaped permanent magnet is positioned in the vicinity of the magnet of the substrate pressing member. This creates a magnetic force between the magnets, causing the substrate pressing member to pivot so that the substrate pressing member contacts the edge of the substrate with a predetermined amount of pressure.

19 Claims, 17 Drawing Sheets

F I G. 13
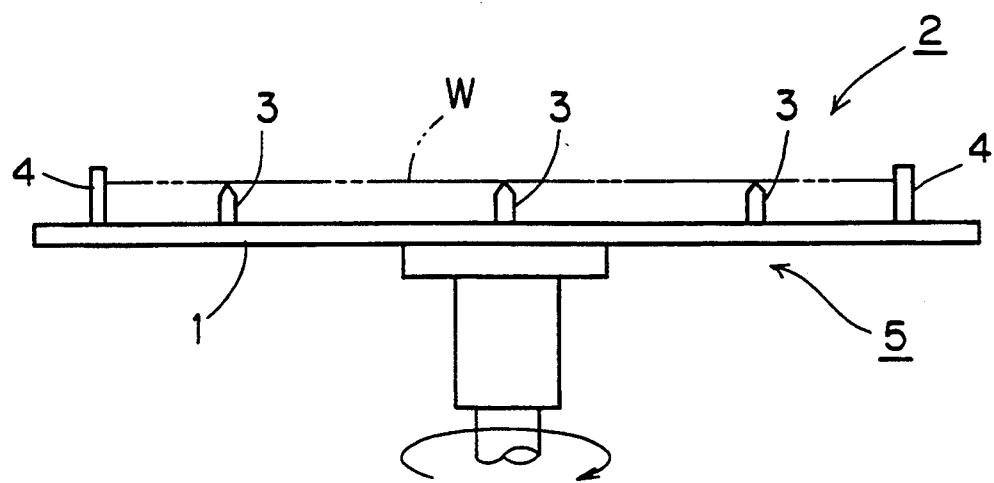

DEVICE FOR HOLDING AND ROTATING A SUBSTRATE

BACKGROUND OF THE INVENTION

1. Field of the Invention

The present invention relates to a device for use in a rotation-type substrate processing apparatus, in which a substrate is processed with various processing liquids such as cleaning liquid and etching liquid applied onto the substrate The substrate is held and rotated by the device (hereinafter referred to as "a spin head"). The term "substrate" refers to an approximately round-shaped substrate such as a semiconductor wafer or a completely round-shaped substrate such as an optical disk substrate.

2. Description of the Background Art

In a rotation-type substrate processing apparatus for processing substrates such as a semiconductor wafer and a glass substrate for a photomask which must be extremely thoroughly cleaned, maximum possible suppression of a slipping between a substrate and holding members which hold the substrate while the substrate is rotated is necessary. This is because such a slippage causes the substrate surface to be chipped and damaged, and also causes dust to adhere to the substrate surface. This also causes the processing liquid to flow unevenly, which eventually deteriorates the quality of processing. To solve the above problems, various conventional techniques for suppressing a slippage of a spinning substrate have been developed including the one disclosed in Japanese Patent Laid-Open Gazette No. 51-132972 and the one disclosed in Japanese Patent Examined Gazette No. 3-9607 which was filed by the same applicant as in the present application.

In an apparatus according to the former conventional technique, centrifugal arms are attached to a horizontal rotation stage for engagement with the outer edge of a horizontally resting substrate, and pushed against the outer edge of the substrate by a centrifugal force which is created as the horizontal rotation stage rotates. An apparatus according to the latter conventional technique requires movable claws disposed on a horizontal rotation stage for engagement with the outer edge of a horizontally mounted substrate. By moving the claws in a predetermined manner, the substrate is firmly held by the claws at the outer edge under a pressing force acting on the outer edge.

The former conventional technique, however, utilizing centrifugal force to hold the substrate, has a weakness in that suppression of slippage is insufficient when the rotation speed is not high enough, i.e., during an initial period of acceleration and a last period of deceleration of the rotation. The latter technique, on the other hand, always attains suppression of a slippage. However, the latter technique needs a complex structure for the apparatus which requires a high manufacturing cost.

SUMMARY OF THE INVENTION

The present invention is directed to a device for holding and rotating a substrate which has an approximately or completely round-shaped configuration. The device for use in a substrate processing apparatus in which the substrate is processed with processing liquid applied onto the substrate. The device may preferably include: a rotation stage horizontally rotating about a rotation axis; a plurality of substrate holding members disposed on the rotation stage for supporting the substrate; a substrate pressing member supported so as to be rotatable about a predetermined axis with respect to the rotation stage, the substrate pressing member including a first magnetic member, the substrate pressing member having a pressing surface; and a second magnetic member in the form of a ring disposed around the rotation axis of the rotation stage, the second magnetic member being capable of moving relative to the rotation stage, at least one of the first and second magnetic members being a magnet previously magnetized, wherein at least one of the first magnetic member and the second magnetic member moves relative to the other so as to exert a magnetic force, thereby to allow the substrate pressing member to rotate about the predetermined axis, so that the pressing surface of the substrate pressing member contacts an edge of the substrate with a predetermined amount of pressure.

In an aspect of the present invention, a device includes: a rotation stage horizontally rotating about a rotation axis; a plurality of substrate holding members disposed on the rotation stage for supporting the substrate; a substrate pressing member supported so as to freely move with respect to the rotation stage, the substrate pressing member including a first magnetic member, the substrate pressing member having a pressing surface; and a second magnetic member disposed in the vicinity of the rotation axis of the rotation stage, wherein magnetic force which is created between the first and second magnetic members, allows the substrate pressing member to move so that the pressing surface of the substrate pressing member contacts an edge of the substrate with a predetermined amount of pressure.

Accordingly, it is an object of the present invention to provide device having a simple structure for holding and rotating a substrate, the device being for use within a substrate processing apparatus in which it is possible to suppress a slippage of a substrate during any period of rotation of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a front view of a spin head according to a modification of the present invention.

DESCRIPTION OF THE PREFERRED EMBODIMENTS

Preferred Embodiment of Rotation-type Substrate Processing Apparatus

Figure 2:
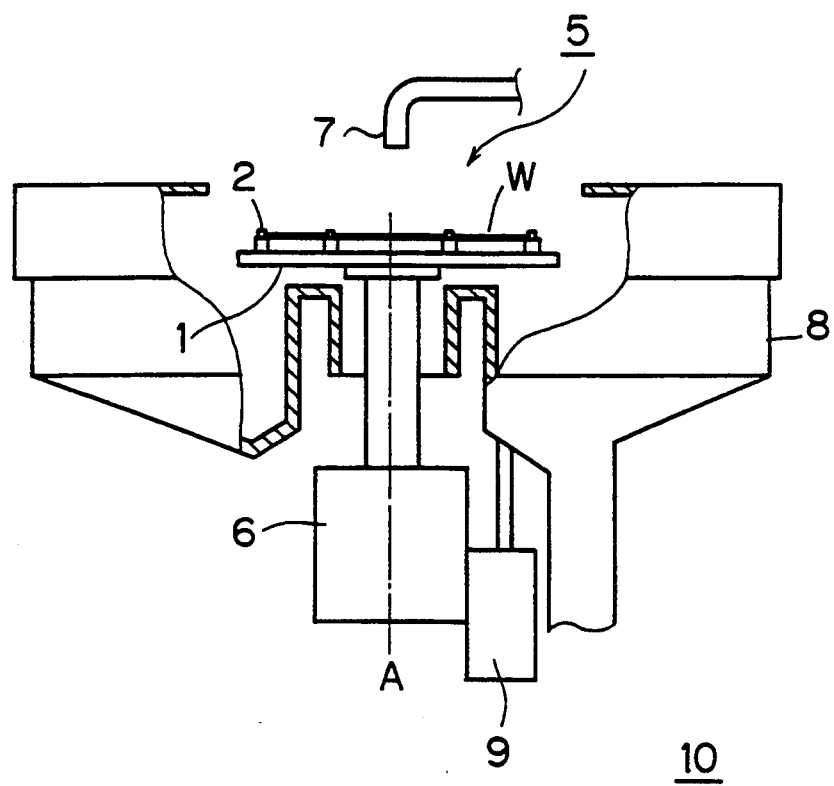
FIG. 2 is a partial cross-sectional front view a rotation-type substrate processing apparatus including the spin head.

FIG. 2 is a partially cut-away side view schematically illustrating the overall structure of a rotation-type substrate processing apparatus which employs a device for holding and rotating a substrate, i.e., a spin head according to a preferred embodiment of the present invention.

The rotation-type substrate processing apparatus 10 includes a spin head 100 for holding and rotating a substrate W, a nozzle 7 for supplying processing liquid and a cup 8 for catching processing liquid. The spin head 100 includes a spin chuck 5 and a motor 6 for rotating the spin chuck 5. The nozzle 7 supplies various processing liquid, for example, cleaning liquid such as acid or alkaline or other solution and pure water, photo resist solution, developing solution or etchant. A rotation shaft of the motor 6 is inserted in the cup 8. Surrounding the substrate W from the side and from the bottom, the cup 8 collects the processing liquid that is spun off from the substrate W.

The spin chuck 5 includes a rotation stage 1 which is rotated in a horizontal direction by the motor 6, a plurality of substrate holding members 2 which are fixed on the rotation stage 1 at the peripheral portion, and a substrate pressing member (not shown in FIG. 2) which is also disposed on the peripheral portion of the rotation stage 1 for free rotation.

Held by the spin chuck 5, the substrate W is horizontally rotated. A predetermined processing liquid is applied onto the top surface of the rotating substrate W, whereby surface treatment of the substrate W is performed. The cup 8 is driven by a vertical movement driving source 9 which is formed by an air cylinder, and is movable in a vertical direction with respect to the spin chuck 5, i.e., the cup 8 is movable upward or downward in a direction of the rotation shaft of the spin chuck 5. The cup 8 is positioned relatively lower when the substrate W is mounted onto and detached from the spin chuck 5, but positioned relatively higher when the substrate W is rotated and processed. FIG. 2 shows the cup 8 being positioned for the latter process. A ring-shaped magnet described later (not shown in FIG. 2) is secured to the cup 8 and moved upward or downward with the cup 8.

As described above, the vertical movement driving source 9 is formed by an air cylinder in this embodiment. However, the vertical movement driving source 9 may be constructed as a motor-driven mechanism which moves the cup by rotation of a screw, or may be constructed as an electromagnetic actuator.

First Preferred Embodiment of Spin Head

Figure 1:
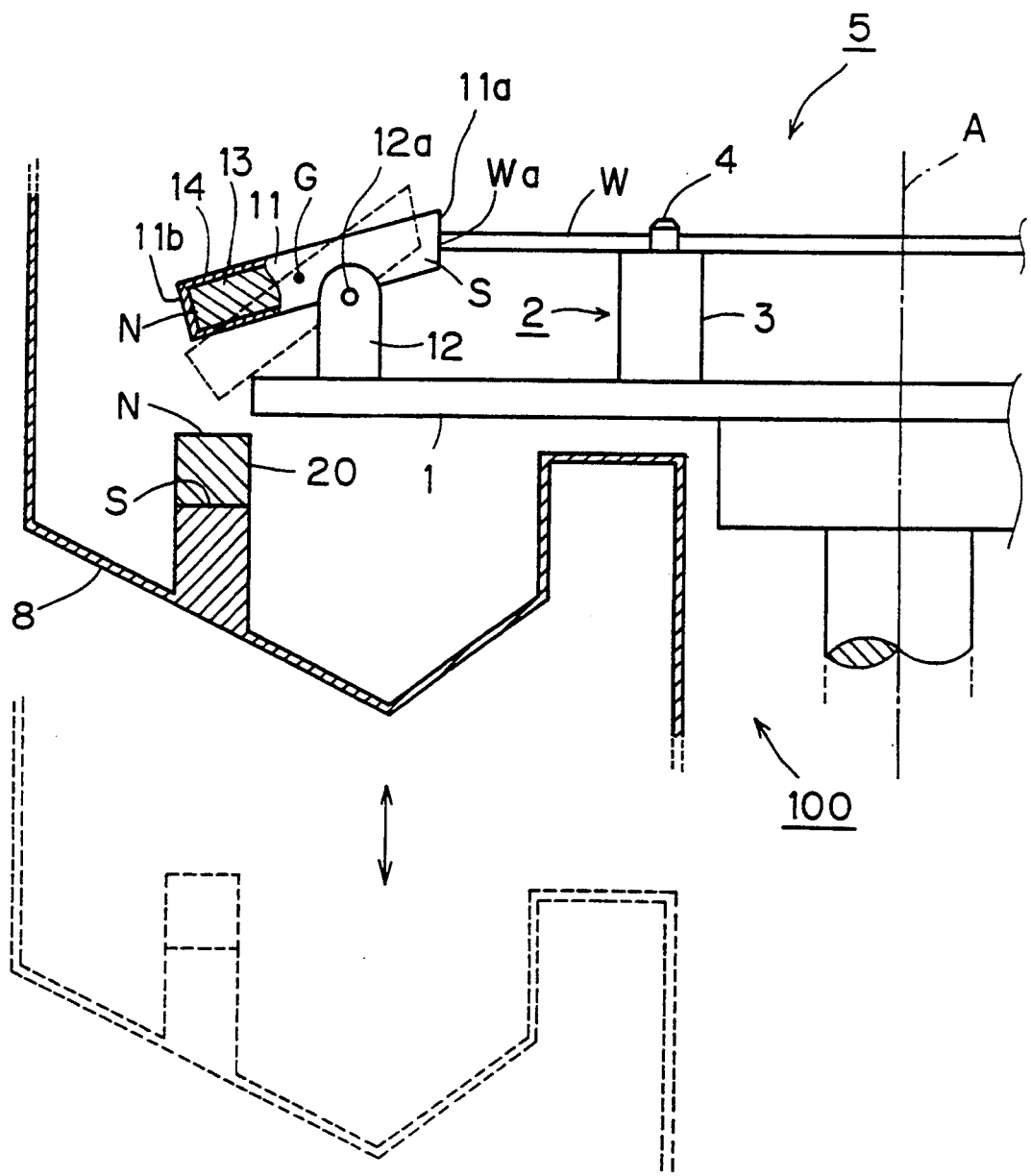
FIG. 1 is a partial cross-sectional front view of a spin head according to a first preferred embodiment of the present invention.
Figure 3:
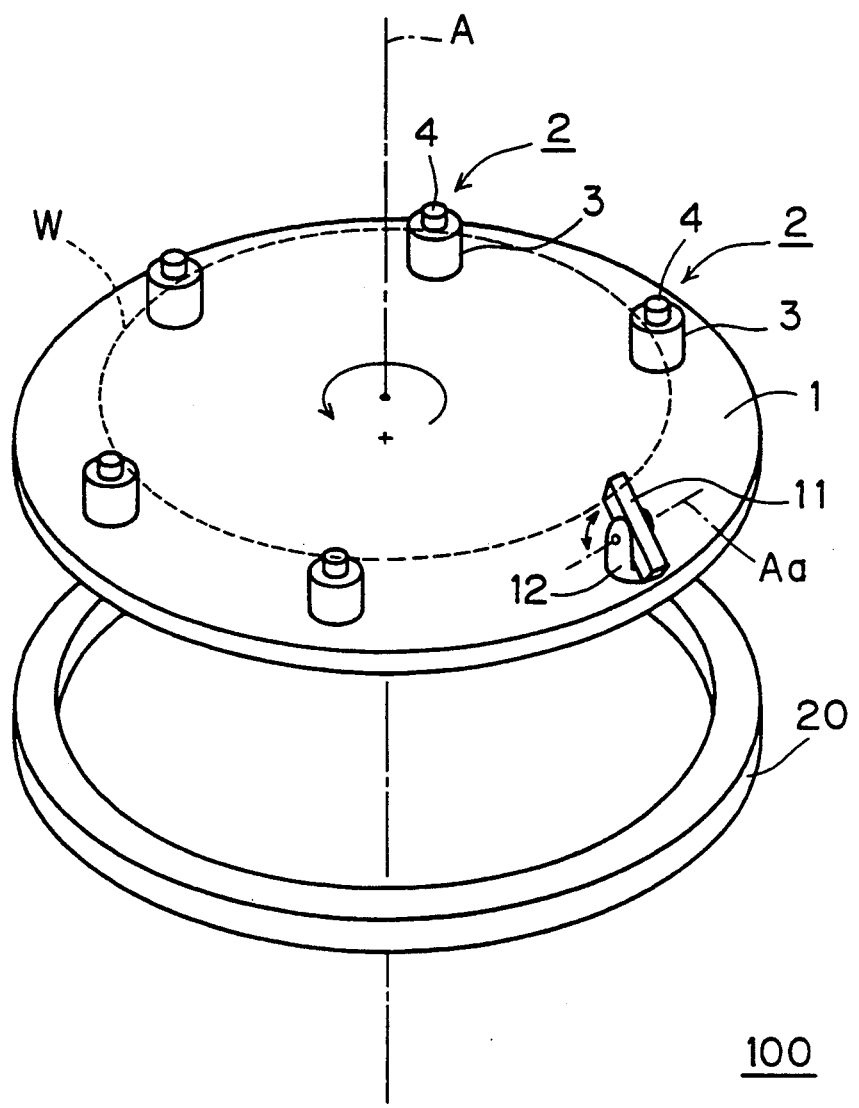
FIG. 3 is a perspective view of the spin head according lo the first preferred embodiment of the present invention.

FIG. 3 is a perspective view of a spin head 100 according to a first preferred embodiment of the present invention. FIG. 1 is a partial cross-sectional front view illustrating a structure and an operation of the spin head 100.

A plurality of substrate holding members 2 disposed on the top surface of a rotation stage 1 are each a one piece member which is formed by a substrate supporting member 3 and a horizontal position restricting member 4. The substrate supporting members 3 at the respective top surfaces receive a backside outer edge portion of the substrate W so that the substrate W is horizontally supported at a distance from the rotation stage 1. The horizontal position restricting members 4, in contact at the respective side surfaces with an outer edge Wa of the substrate W, restrict the horizontal position of the substrate W. Further, on a peripheral portion of the top surface of the rotation stage 1, a rotational bearing member 12 is fixed which supports a substrate pressing member 11 in such a manner that the substrate pressing member 11 is rotatable in a vertical plane which extends along the direction of the radius of the rotation stage 1. A ring-shaped magnet 20 is disposed on an inner bottom surface of the cup 8. The ring-shaped magnet 20, a permanent magnet, is located at a position lower than the rotation stage 1, and extends in the form of a ring as if it traces a circle around the rotation axis A of the rotation stage 1. The N-pole of the magnet is on the top surface side of the ring-shaped magnet 20 and the S-pole of the magnet is on the bottom surface side of the ring-shaped magnet 20, for example. Coated with resin or enveloped in a resin or a non-magnetic case, the ring-shaped magnet 20 is rustproof.

The substrate pressing member 11 includes a permanent magnet 13 and a resin film 14 covering the whole surface of the permanent magnet 13 as shown in FIG. 1. Further, the substrate pressing member 11 has at an inner side end a pressing surface 11a which is allowed direct contact with the outer edge Wa of the substrate W. The substrate pressing member 11 is disposed so that the center of gravity G thereof is located outside of and beyond a fulcrum 12a of the bearing member 12, i.e., on the opposite side to the pressing surface 11a as viewed from the fulcrum 12a. When moved upward or downward with movement of the cup 8, the ring-shaped magnet 20 moves toward or away from another end 11b of the substrate pressing member 11 which is formed on the side opposite to the pressing surface 11a. The permanent magnet 13 has, for instance, an N-pole at the end 11b which is to face the ring-shaped magnet 20 and an S-pole at the other end, namely, the pressing surface 11a.

Before and after processing the substrate W, that is, when the substrate W is loaded onto and unloaded from the spin chuck 5, the cup 8 is lowered (dotted line in FIG. 1). At this stage, there is a distance between the ring-shaped magnet 20 and the one end 11b of the substrate pressing member 11. Hence, the permanent magnet 13 is almost free from the influence of the magnetic force of the ring-shaped magnet 20. Since the center of gravity G is positioned on the side of the one end 11b with respect to the fulcrum 12a, due to gravity, the substrate pressing member 11 is in a position indicated by the dotted line in FIG. 1. In other words, the pressing surface 11a, not in contact with the outer edge Wa, releases the substrate W.

On the other hand, at the beginning of rotation of the substrate W for processing the substrate W, prior to the rotation, the cup 8 is moved upward as previously described. During the rotation, the cup 8 is maintained at a higher position (solid line in FIG. 1). Here, magnetic repulsion is created between the magnetic pole at the top surface of the ring-shaped magnet 20 (N-pole) and the magnetic pole at the one end 11b of the substrate pressing member 11 (N-pole). This forces the substrate pressing member 11 to rotate about the fulcrum 12a along the radius of the substrate W in a clockwise direction in the drawing of FIG. 1, wherein the pressing surface 11a contacts and presses the outer edge Wa in a manner indicated by the solid line in FIG. 1. As a result, with the outer edge Wa radially pressed inward by the pressing surface 11a and the side surfaces of the horizontal position restricting members 4 which are located in an opposing relationship with the substrate pressing member 11, the substrate W is firmly held.

Since the ring-shaped magnet 20 is disposed as if to trace a circle about the rotation axis A, the magnetic repulsion stays constant, independently of the pivotal position of the substrate pressing member 11. The rotation speed of the rotation stage I does not influence the magnetic repulsion. Hence, during the entire period of rotating and processing the substrate W, a constant force is applied upon the outer edge Wa. This advantageously allows no slippage of the substrate W in the spin head 100 while the substrate W is held and rotated during processing.

In addition, since the substrate pressing member 11 is driven by magnetic force which is created between mutually remote members, the mechanism for driving the substrate pressing member 11 is simple. Further, since the vertical movement driving source 9 for moving the cup 8 also functions as the mechanism for moving the ring-shaped magnet 20 in a vertical direction, there is no need to dispose an additional vertical-direction driving mechanism especially for the ring-shaped magnet 20. Thus, the spin head 100 according to the first preferred embodiment has a much simpler structure than the conventional device.

Second Preferred Embodiment of Spin Head

Figure 4:
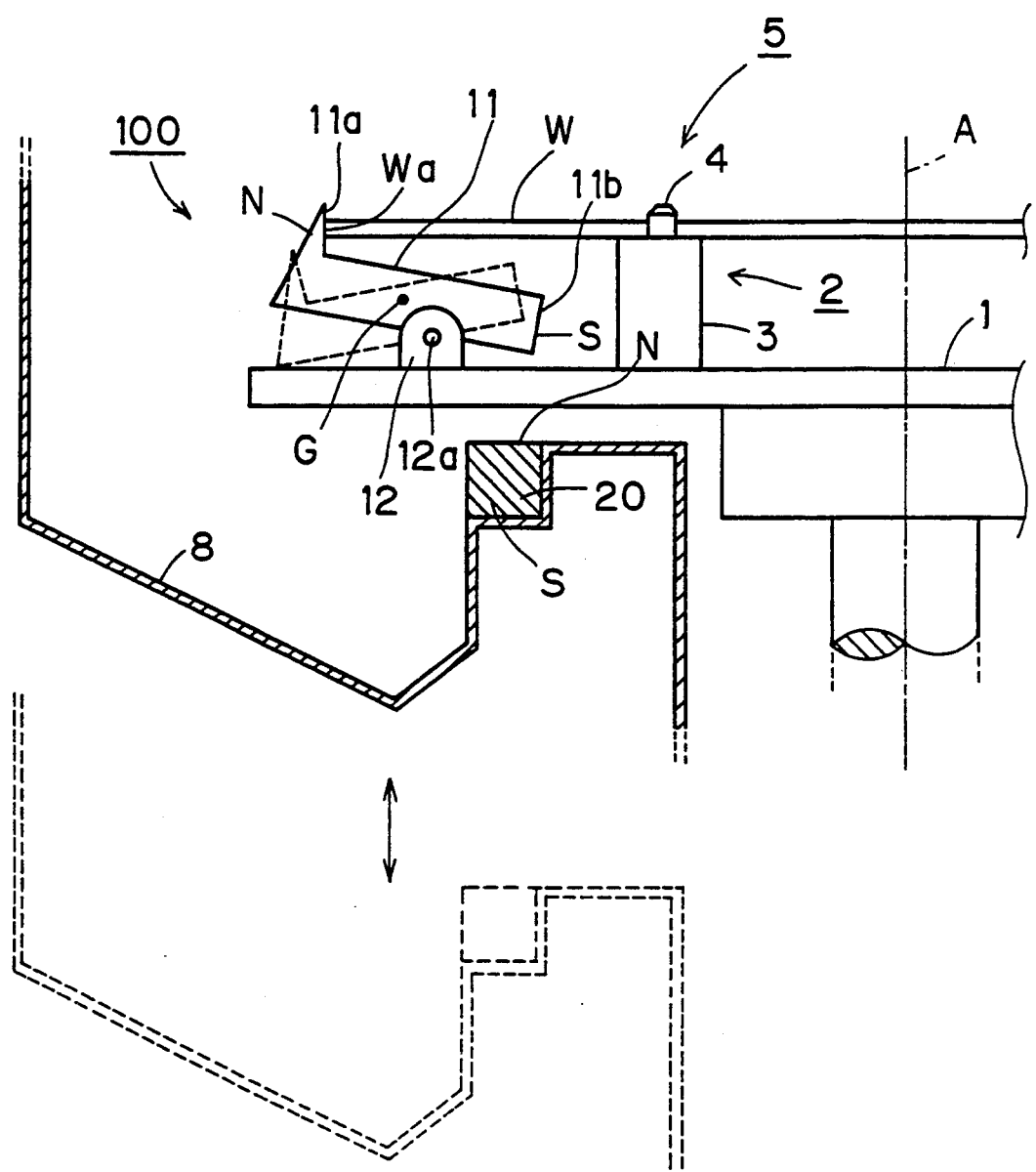
FIG. 4 is a partial cross-sectional front view of a spin head according to a second preferred embodiment of the present invention.

FIG. 4 is a partial cross-sectional front view explaining a structure and an operation of the spin head 100 according to a second preferred embodiment of the present invention. In this embodiment, the center of gravity G of the substrate pressing member 11 which comprises a permanent magnet is positioned on the side of the pressing surface 11a as viewed from the fulcrum 12a of the bearing member 12, i.e., beyond the fulcrum 12a on the outer edge side of the substrate W. The ring-shaped magnet 20 is moved toward and away from the one end 11b of the substrate pressing member 11 which is formed on the side opposite to the pressing surface 11a. The top surface of the ring-shaped magnet 20 has an N-pole and the bottom surface of the ring-shaped magnet 20 has an S-pole. The S-pole of the substrate pressing member 11 is formed at the one end 11b and the N-pole of the substrate pressing member 11 is formed at the pressing surface 11a. The rotation stage 1 is fabricated from a non-magnetic material.

Before and after the processing of the substrate W, that is, when the cup 8 is located at a lower position (dotted line in FIG. 4), the substrate pressing, member 11, with the center of gravity G deviated toward the pressing surface 11a, is in the position indicated by the dotted line in FIG. 4. In other words, the pressing surface 11a loses contact with the outer edge Wa so that the substrate W is released. On the other hand, during the processing of the substrate W, that is, when the cup 8 is in a position shown by the solid line in FIG. 4, the magnetic polarity N at the top surface of the ring-shaped magnet 20 and the magnetic polarity S at the one end 11b of the substrate pressing member 11 attract each other by magnetic force created therebetween. This allows the substrate pressing member 11 to rotate about the fulcrum 12a along the radius of the substrate W in a clockwise direction in FIG. 4 into the position that is shown by the solid line in FIG. 4, wherein the pressing surface 11a contacts and presses the outer edge Wa. As a result, as in the first preferred embodiment, with the outer edge Wa pressed radially inward by the pressing surface 11a and the side surfaces of the horizontal position restricting members 4 which are located in an opposing relationship with the substrate pressing member 11, the substrate W is firmly held. Similar to the first preferred embodiment, the second preferred embodiment provides a device having a simple structure which eliminates slippage of the rotating substrate W while the substrate W is held and processed.

Third Preferred Embodiment of Spin Head

Figure 5:
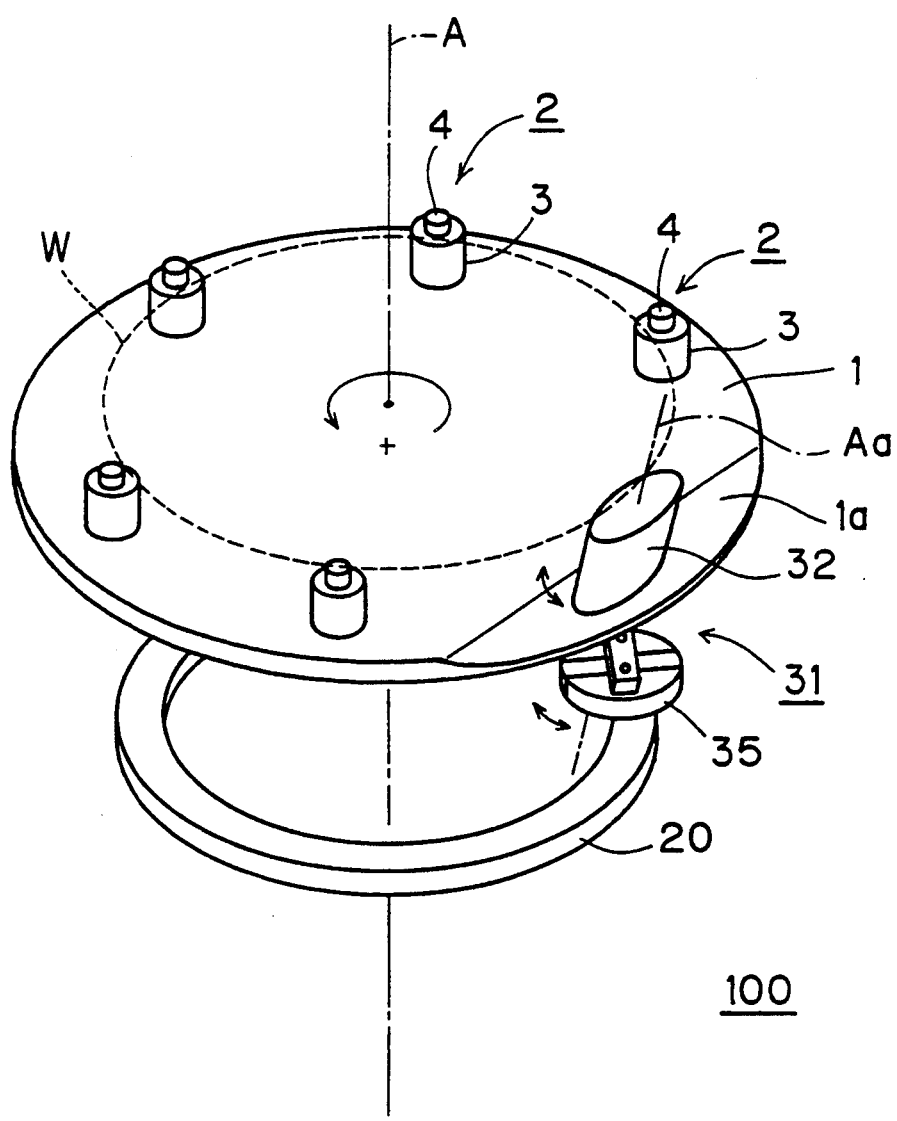
FIG. 5 is a perspective view of a spin head according to a third preferred embodiment of the present invention.

FIG. 5 is a perspective view showing a structure of the spin head 100 according to a third preferred embodiment of the present invention. On the top surface of the rotation stage 1 at the peripheral portion, a plurality of the substrate holding members 2 are disposed, and a substrate pressing member 31 is rotatably supported. The top surface of the rotation stage 1 where the substrate pressing member 31 is attached is bevelled downward by a certain amount so as to form a slope 1a, located at a periphery of the rotation stage 1 The substrate pressing member 31 is rotatable about an axis Aa which extends perpendicular to the slope 1 a, i.e., oriented so as to depart from the rotation axis A of the rotation stage 1 and extending a certain distance above the stage 1.

Figure 6:
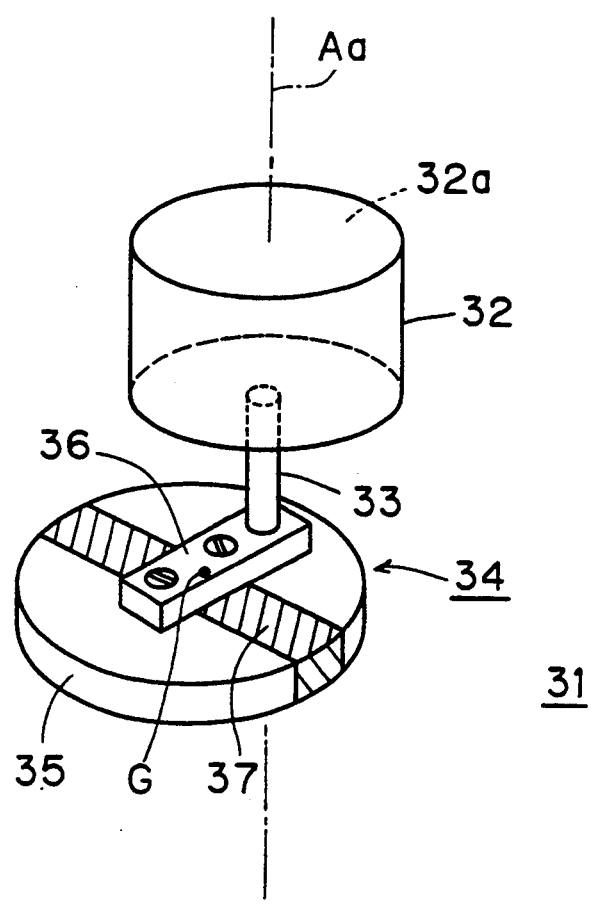
FIG. 6 is a perspective view of a substrate pressing member of the third preferred embodiment of the present invention.

FIG. 6 is a perspective view showing a structure of the substrate pressing member 31. The substrate pressing member 31 includes a cylindrical ellipsoid press body 32 which is formed of a resin or resin-coated metal member. A rod 33, which serves as the axis Aa, is fixedly linked at an end with the press body 32 at the position or in the vicinity of the center axis of the press body 32. The other end of the rod 33 is fixedly engaged with a weight 34. The axis of the rod 33 extends parallel to the center axis of the press body 32. The weight 34 includes a plate-like shaped main weight body 35 and a link member 36 which links the rod 33 and the main weight body 35. The rod 33 is combined with the main weight body 35 at an off-centered position so that the center of gravity G of the substrate pressing member 31 is deviated from the rod 33. The main weight body 35 contains therein a permanent magnet 37. The rod 33 is made of stainless steel or the like. The surfaces of the respective portions of the weight 34, at least, are formed by a resin material. The respective portions of the weight 34 except for the permanent magnet 37 are formed by a non-magnetic material.

Figure 7A:
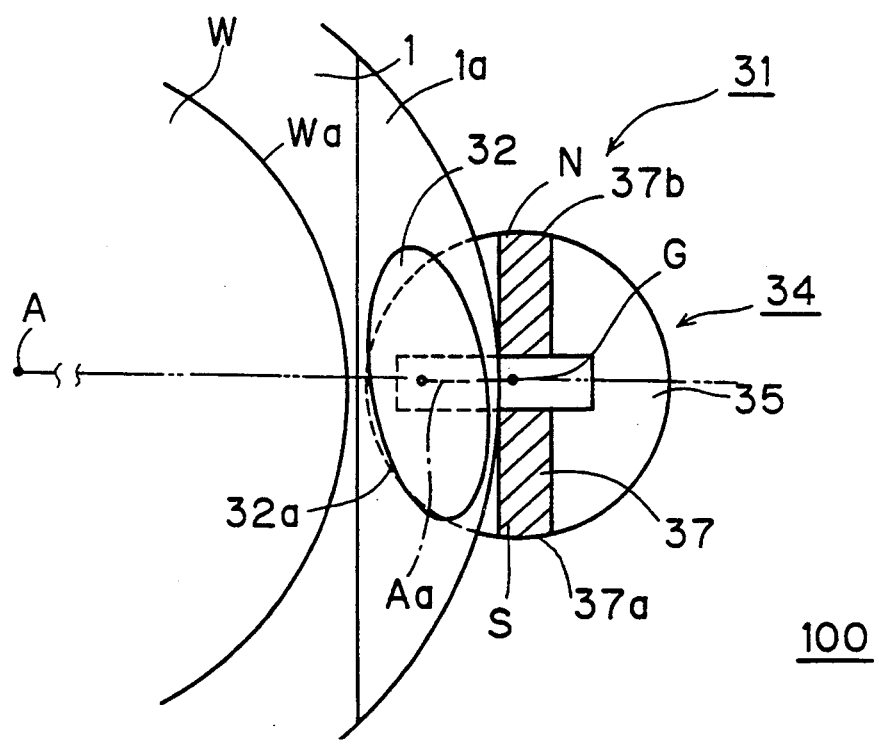
FIGS. 7A and 7B, 8A and 8B are views showing a structure of the spin head according to the third preferred embodiment of the present invention.
Figure 7B:
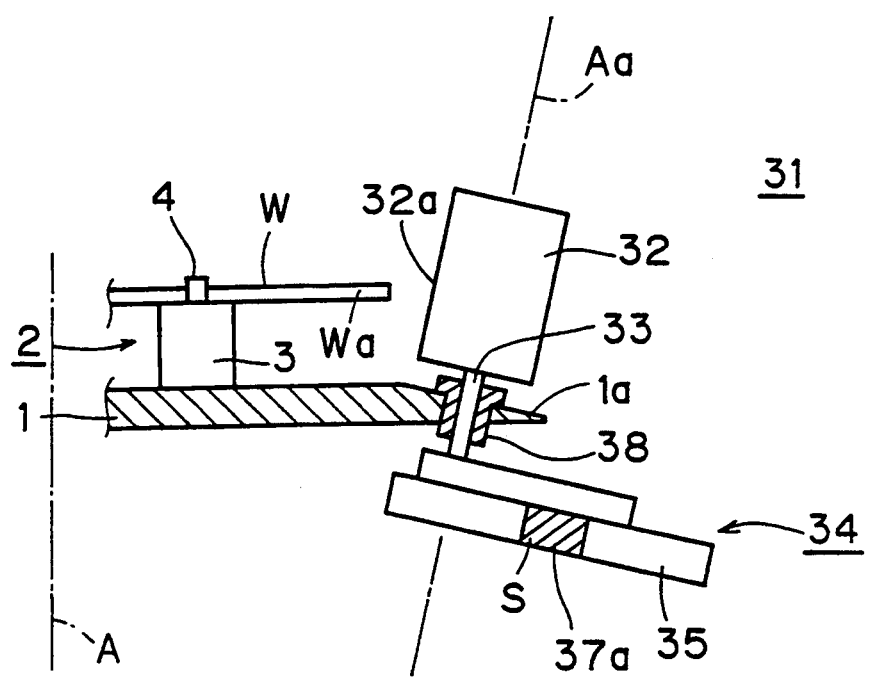
Figure 7B:
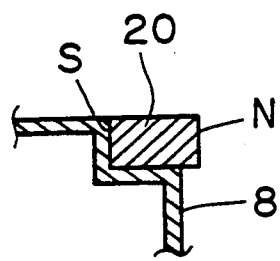
Figure 8A:
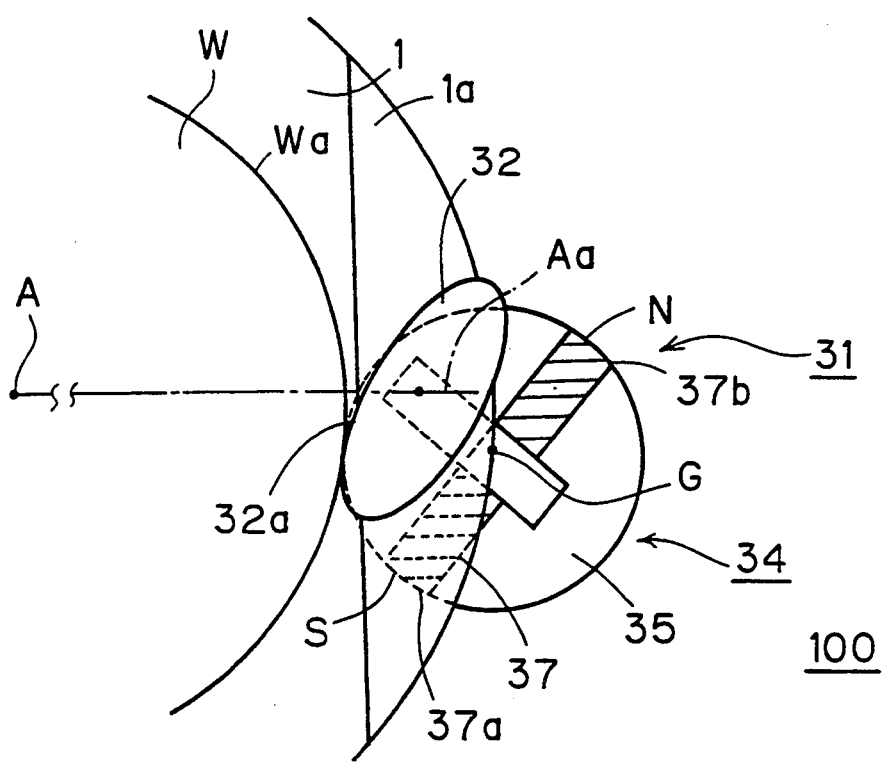
Figure 8B:
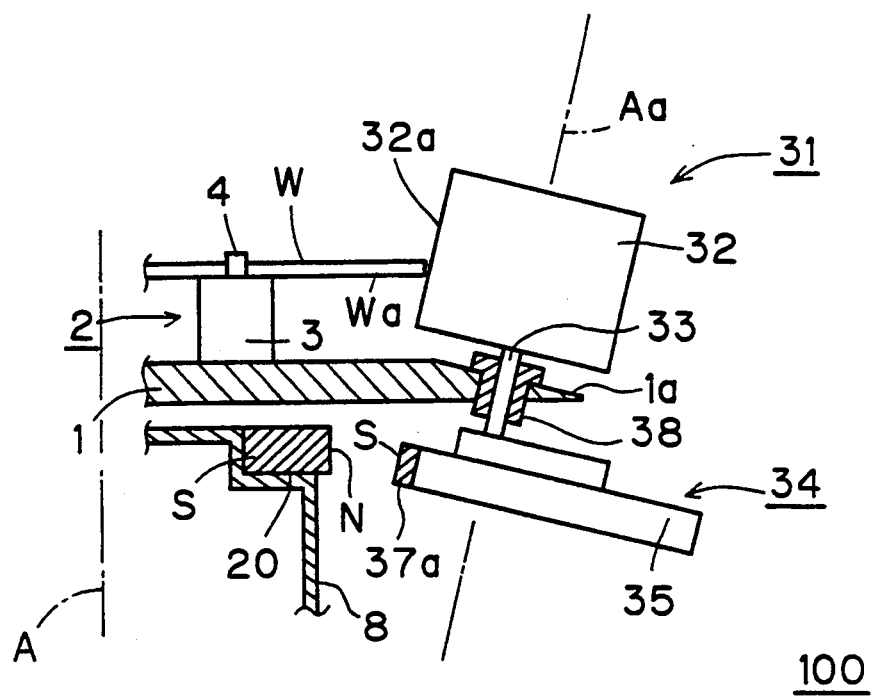

FIGS. 7A and 8A are plan views and FIGS. 7B and 8B are partial cross-sectional front views, respectively, illustrating a structure and an operation of the spin head 100 according to the third preferred embodiment. The rod 33 is supported rotatably at the slope 1a through a bearing member 38, so that friction generated by rotation of the rod member 38 is suppressed. A pressing surface 32a which is allowed direct contact with the outer edge Wa is formed on a side surface of the press body 32. The ring-shaped magnet 20 is disposed on an inner bottom surface of the cup 8 at a position that permits the ring-shaped magnet 20 to approach the main weight body 35 but to remain closer to the rotation axis A than to the main weight body 35 when the cup 8 is located at a high position. The N-pole is located at the outer surface side of the ring-shaped magnet 20 and the S-pole is located at the inner surface side of the ring-shaped magnet 20, for example. To adapt to this, the permanent magnet 37 is formed to have an S-pole at one end 37a thereof which is to closely face the ring-shaped magnet 20 and an N-pole at the other end 37b.

Since the center of gravity G of the substrate pressing member 31 is deviated from the axis Aa and the axis Aa is inclined with respect to a vertical direction, before and after the processing of the substrate W, that is, when the magnetic force of the lowered ring-shaped magnet 20 does not exert any influence upon the substrate pressing member 31 (FIGS. 7A and 7B), due to the center of gravity acting upon the substrate pressing member 31, the center to gravity G is positioned on the opposite side of the rotation axis A with respect to the axis Aa in the radial direction (double dotted line). At this stage, the press body 32 is in a position as that illustrated in FIGS. 7A and 7B wherein the pressing surface 32a is not in contact with the outer edge Wa to release the substrate W.

On the other hand, during the processing of the substrate W, that is, when the ring-shaped magnet 20 is located at a high position (FIGS. 8A and 8B), the magnetic polarity N located at the outer surface of the ring-shaped magnet and the magnetic polarity S located at the one end 37a of the permanent magnet 37 attract each other by magnetic force developed therebetween. This forces the rod 33 to rotate, and hence, the press body 32 which is secured to the rod 33 to pivot into a position shown in FIGS. 8A and 8B in which the pressing surface 32a presses the outer edge Wa in direct contact therewith. As a result, as in the devices according to the first and the second preferred embodiments, with the outer edge Wa pressed radially inward by the pressing surface 32a and the side surfaces of the horizontal position restricting members 4 which are located in an opposing relationship with the press body 32, the substrate W is firmly held. In a similar manner to that described previously with respect to the first and the second preferred embodiments, the device (spin head 100) has a simple structure and no slippage of the rotating substrate W results while the substrate W is held and spun during processing in the third preferred embodiment.

Fourth Preferred Embodiment of Spin Head

Figure 9:
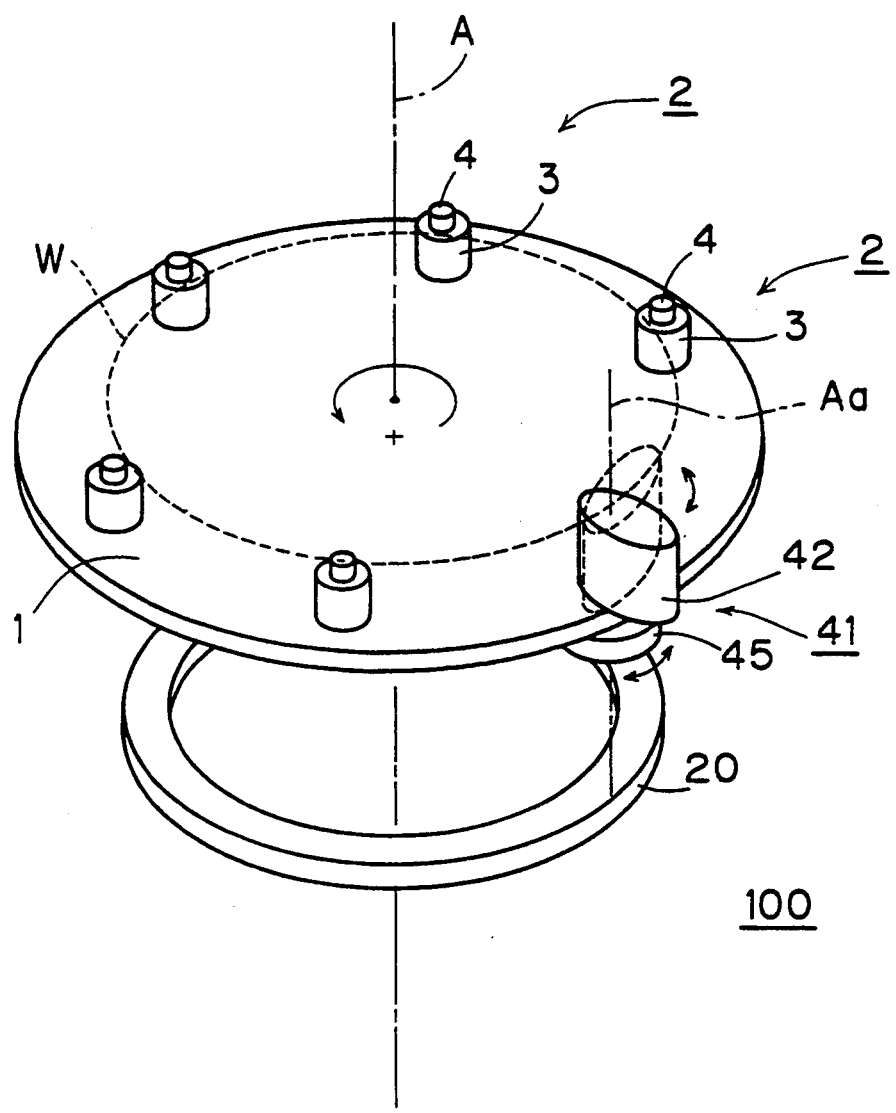
FIG. 9 is a perspective view of a spin head according to a fourth preferred embodiment of the present invention.

FIG. 9 is a perspective view showing a structure of the spin head 100 according to a fourth preferred embodiment of the present invention. On the top surface of the rotation stage 1 at the peripheral portion, instead of substrate pressing member 31 used in the third preferred embodiment, a substrate pressing member 41 is disposed. The substrate pressing member 41 is rotatably supported on the rotation stage 1 so that an axis Aa of the substrate pressing member 41 extends parallel with the rotation axis A.

Figure 10:
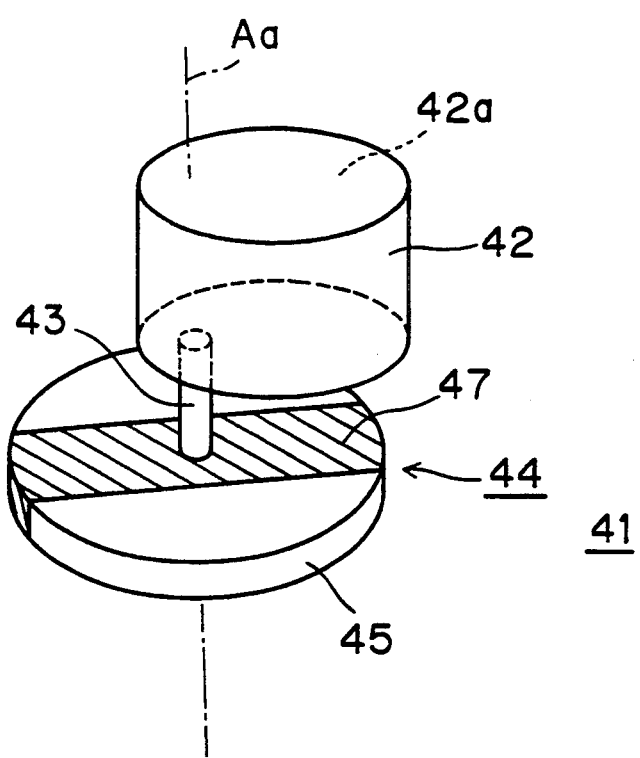
FIG. 10 is a perspective view of a substrate pressing member of the fourth preferred embodiment of the present invention.

FIG. 10 is a perspective view of the substrate pressing member 41. The substrate pressing member 41 includes a cylindrical ellipsoid press body 42 which is formed of resin or a resin-coated metal member. A rod 43 is fixedly linked at an end with the press body 42 at a position which is offset from the center axis of the press body 42 along the longer radius of the ellipse. The other end of the rod 43 is fixedly engaged with a permanently magnetic holding member 44 approximately at the center of the permanently magnetic holding member 44. The axis of the rod 43 is parallel with the center axis or the press body 42. The permanently magnetic holding member 44 includes a main holding body 45 and a permanent magnet 47. The rod 43 is made of stainless steel or the like. The permanent magnet 47 is coated with resin on the surface. The main holding body 45 is also formed by resin at least at the surface but otherwise formed by a non-magnetic material.

Figure 11A:
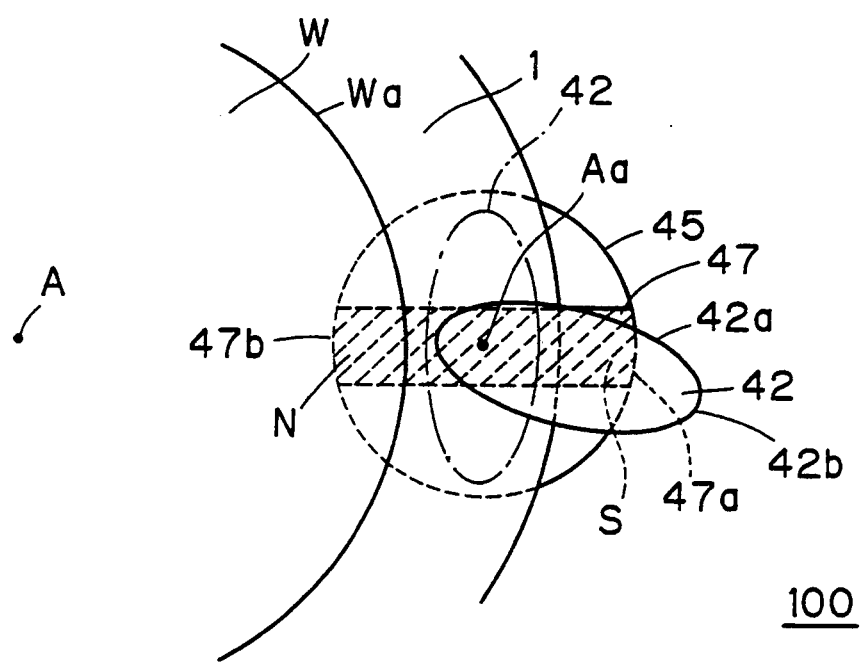
FIGS. 11A, 11B, 12A and 12B are views showing a structure of the spin head according to the fourth preferred embodiment of the present invention.
Figure 11B:
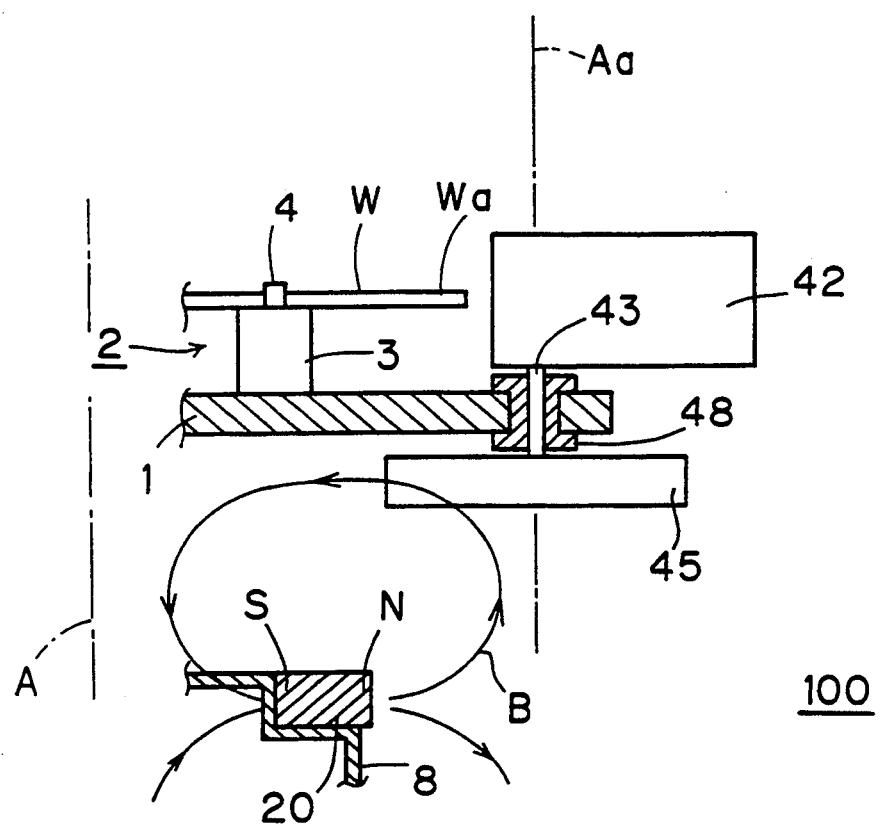
Figure 12A:
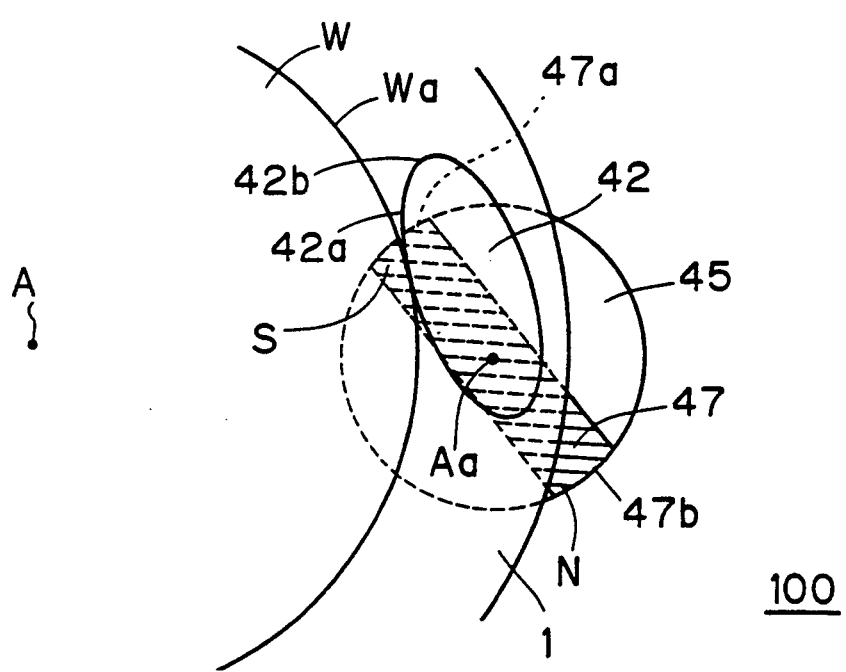
Figure 12B:
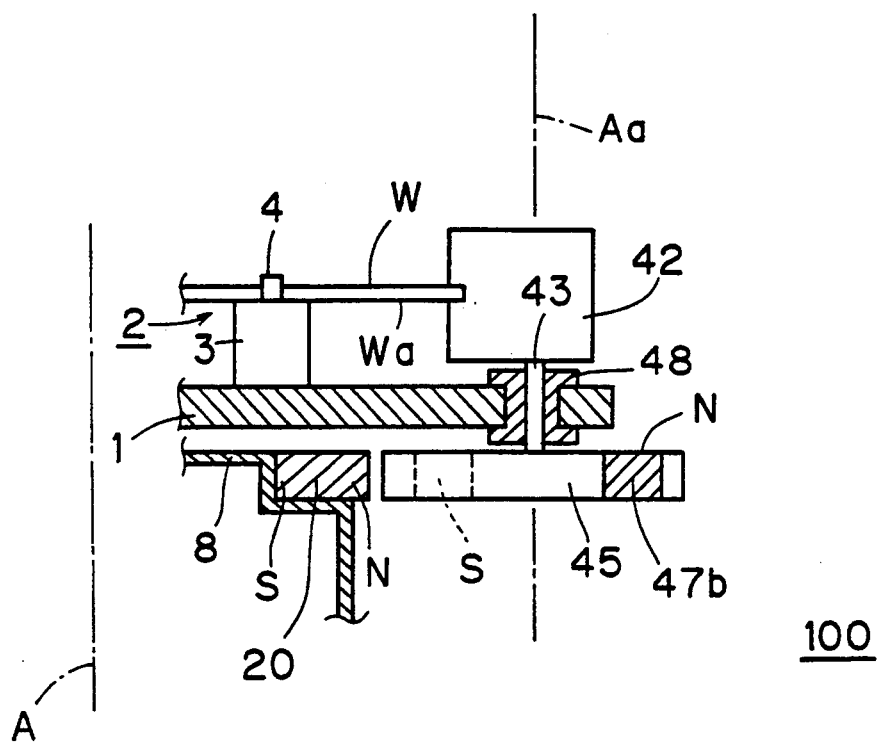

FIGS. 11A and 12A are plan views and FIGS. 11B and 12B are partial cross-sectional front views, respectively, illustrating a structure and an operation of the spin head 100 according to the fourth preferred embodiment. The rod 43 is rotatably supported by the rotation stage 1 through a bearing member 48. To suppress friction during the rotation of the rod 43, the bearing member 48 includes a bearing mechanism, for example. On a side surface of the press body 42, a pressing surface 42a is formed which is to be brought into contact with the outer edge Wa. The ting-shaped magnet 20 is disposed on an inner bottom surface of the cup 8 in such a manner that the ring-shaped magnet 20 approaches the main holding body 45 but remains closer to the rotation axis A than to the main holding body 45 when the cup 8 is located at a high position. The N-pole is created at the outer surface side of the ring-shaped magnet 20 and the S-pole is created at the inner surface side of the ring-shaped magnet 20, for example. To adapt to this, the permanent magnet 47 is formed so as to have an S-pole at one end 47a thereof which is in the vicinity of one end 42b of the press body 42, which is farthest from the axis Aa, and an N-pole at the other end 47b thereof.

The ring-shaped magnet 20 is located at a low position before and after the processing of the substrate W (FIGS. 11A and 11B). At the location of the permanent magnet 47, a line of magnetic force B developed by the ring-shaped magnet 20 runs toward the rotation axis A. If the coercive force of the ring-shaped magnet 20 is properly set, the magnet 20 attracts the one end 47b (N-pole) of the permanent magnet 47 toward the rotation axis A while ejecting the other end 47a (S-pole) of the permanent magnet 47 away from the rotation axis A. Hence, as shown in FIGS. 11A and 11B, the permanent magnet 47 extends in a radial direction of the rotation axis A. Here, the press body 42 is in a position as that shown in FIGS. 11A and 11B so that the pressing surface 42a, which is not in contact with the outer edge Wa, releases the substrate W.

On the other hand, during the processing of the substrate $W^1$, that is, when the ring-shaped magnet 20 is located at a high position (FIGS. 12A and 12B), the magnetic polarity N at the outer surface of the ring-shaped magnet 20 and the magnetic polarity S at the one end 47a of the permanent magnet 47 attract each other by the magnetic force created therebetween. This causes the rod 43 to rotate, and hence, the press body 42 which is fixed to the rod 43 to pivot into a position as shown in FIGS. 12A and 12B in which the pressing surface 42a presses the outer edge Wa into direct contact therewith. As a result. with the outer edge Wa pressed radially inward by the pressing surface 42a and the side surfaces of the horizontal position restricting members 4 which are located in an opposing relationship with the press body 42, the substrate W is firmly held. Similar to the first to the third preferred embodiments, the fourth preferred embodiment simplifies the structure of the device (spin head 100) allows no slippage of the rotating substrate W while the substrate W is held and spun during processing.

Modification (1) The substrate holding members 2 do not have to be one piece members each formed by the substrate supporting member 3 and the horizontal position restricting member 4. That is, as shown in FIG. 13, the substrate holding member 2 may be a combination of the substrate supporting members 3 and the horizontal position restricting members 4 which are independently seated on the top surface of the rotation stage 1. The substrate pressing member is omitted in FIG. 13.

(2) The press bodies 32 and 42 do not have to be formed with a cylindrical oval shape but may be formed in other configurations as long as the press bodies are capable of performing the expected functions.

(3) The rotation-type substrate processing apparatus 10 is not limited to such an apparatus which pours processing liquid onto the top surface of a substrate to process the substrate, but may constitute any other rotation-type substrate processing apparatus in which a substrate is dried while horizontally rotated.

(4) In the preferred embodiments heretofore described, it is not always necessary to dispose magnets in both the substrate pressing member and the ring-shaped magnet 20. Instead, a ferromagnetic member which has never been magnetized yet may be disposed in the substrate pressing member 11, for example, in place of the permanent magnet. The permanent magnets contained in the substrate pressing member 31 and the ring-shaped magnet 20 may also be replaced by such a strong magnetic substance.

(5) The fourth preferred embodiment may be modified with respect to the position of the press body 42. That is, the press body 42 may be secured to one end of the rod 43 in such a manner that when the outer edge Wa is released from contact with the pressing surface 42a of the press body 42, the center of symmetry of the press body 42 coincides with the pivot axis Aa and the direction of the longer radius of the press body 42 becomes approximately perpendicular to the direction of elongation of the permanent magnet 47 as shown by a dot-and-dash line in FIG. 11A. This modification reduces the distance that the pressing surface 42a of the press body 42 travels when the press body 42 pivots toward the outer edge Wa, which allows that the press body 42 swings into contact with the outer edge Wa at a relatively slow speed. Hence, impact of the pressing surface 42a against the outer edge Wa is eased.

While the invention has been described in detail, the foregoing description is in all aspects illustrative and not restrictive. It is understood that numerous other modifications and variations can be devised without departing from the scope of the invention.

What is claimed is:

1. A device for holding and rotating a substrate, said device comprising:

a rotation stage horizontally rotating about a rotation axis;

a plurality of substrate holding members disposed on said rotation stage for supporting said substrate;

a substrate pressing member rotatable about an axis so as to be movable with respect to said rotation stage, said substrate pressing member including a first magnetic member and a pressing surface; and a second magnetic member forming a ring around the rotation axis of said rotation stage, said second magnetic member being movable relative to said rotation stage, at least one of said first and second magnetic members being a magnet which has been previously magnetized, wherein at least one of said first magnetic member and said second magnetic member moves relative to the other so as to exert magnetic force, thereby to allow said substrate pressing member to rotate about said predetermined axis so that said pressing surface of said substrate pressing member contacts an edge of said substrate with an amount of pressure.

2. A device of claim 1, wherein each of said substrate holding members includes:

a substrate supporting member disposed on said rotation stage for horizontally supporting said substrate so that said substrate is spaced from said rotation stage; and a horizontal position restricting member disposed on one of said substrate supporting member and said rotation stage, for making contact at a side surface thereof with an outer edge of said substrate, to thereby restrict a horizontal position of said substrate.

3. A device of claim 1, further comprising a bearing member including a fulcrum for supporting said substrate pressing member in such a manner that said substrate pressing member is rotatable in a vertical plane which extends in a direction of a radius of said rotation stage.

4. A device of claim 3, wherein a center of gravity of said substrate pressing member is positioned on a periphery side of said rotation stage with respect to said fulcrum.

5. A device of claim 4, wherein said rotation stage is fabricated from a non-magnetic material.

6. A device of claim 3, wherein said substrate pressing member further comprises a resin material which covers a surface of said first magnetic member.

7. A device of claim 1, wherein said substrate pressing member comprises:

a rod member rotatably supported by said rotation stage, said rod member having a first end portion extending toward a top surface side of said rotation stage and a second end portion extending toward a lower surface side of said rotation stage; and a press body fixed to said first end portion of said rod member, a surface of said press body serving as said pressing surface, and wherein said first magnetic member is fixed to said second end portion of said rod member.

8. A device of claim 7, wherein an axis of said rod member is substantially aligned with a center axis of said press body.

9. A device of claim 7, wherein said press body has a cylindrical ellipsoid shape.

10. A device of claim 9, wherein said rod member is disposed eccentrically with respect to said press body along a longer radius of said press body.

11. A device of claim 9, wherein a longer radius of said press body is approximately perpendicular to a plane containing the first magnetic member.

12. A device of claim 1, wherein said substrate pressing member is rotatably supported by said rotation stage so as to rotate in a plane which is not parallel to the rotation axis of said rotation stage.

13. A device of claim 12, wherein the axis of said rod member is parallel to the rotation axis of said rotation stage.

14. A device of claim 12, wherein the axis of said rod member is not parallel to the rotation axis of said rotation stage.

15. A device of claim 14, wherein a slope portion is provided on a top surface of said rotation stage in which a portion of the top surface of said rotation stage is bevelled downward to form a slope portion located at a periphery of said rotation stage, and wherein the predetermined axis of said rod member is approximately perpendicular to the surface of said slope portion.

16. A device of claim 14, wherein a center of gravity of said substrate pressing member is positioned on a periphery side of said rotation stage with respect to the axis.

17. A device of claim 1, further comprising a driving mechanism for moving said second magnetic member in a vertical direction.

18. A device of claim 17, wherein said substrate processing apparatus includes a cup, disposed so as to surround said substrate, for collecting processing liquid emitted from said substrate, and wherein said driving mechanism moves said cup in a vertical direction.

19. A device for holding and rotating a substrate, said device comprising:

a rotation stage horizontally rotating about a rotation axis;

a plurality of substrate holding members disposed on said rotation stage for supporting said substrate;

a substrate pressing member supported to be movable with respect to said rotation stage, said substrate pressing member including a first magnetic member and a pressing surface; and a second magnetic member disposed adjacent to said rotation axis, wherein a magnetic force exists between said first and second magnetic members and allows said substrate pressing member to move so that said pressing surface of said substrate pressing member contacts an edge of said substrate with an amount of pressure.

* * * * *